United States Patent [19]

Alsberg

[11] 4,021,731
[45] May 3, 1977

[54] WAVEGUIDE FAULT LOCATION SYSTEM

[75] Inventor: Dietrich Anselm Alsberg, Berkeley Heights, N.J.

[73] Assignee: Bell Telephone Laboratories, Incorporated, Murray Hill, N.J.

[22] Filed: Mar. 16, 1976

[21] Appl. No.: 667,259

[52] U.S. Cl. .............................. 324/52; 324/58 R; 324/58 B
[51] Int. Cl.$^2$ ........................................ G01R 31/11
[58] Field of Search .......... 324/58 R, 58 B, 58.5 B, 324/52

[56] References Cited
UNITED STATES PATENTS 3,750,012   7/1973   Fellers et al. ...................... 324/52

Primary Examiner—Stanley T. Krawczewicz
Attorney, Agent, or Firm—Stephen M. Gurey

[57] ABSTRACT

A fault interior to an overmoded waveguide transmission line is located by pneumatically propelling an electrically semi-transparent reflecting piston within the waveguide line. The piston is designed to give low forward insertion loss yet at the same time a sufficient reflection in response to a transmitted millimeter wave test pulse stream. By measuring the magnitude of the signal reflected from the piston and returned to the transmitting terminal as the piston is moved along the waveguide length, the transmission loss of the waveguide is determined as a function of distance from the transmitting terminal. By examining the transmission loss measurements for any abnormal step or slope change or ripple which would be indicative of a waveguide fault, the location of a fault can be precisely determined.

11 Claims, 7 Drawing Figures

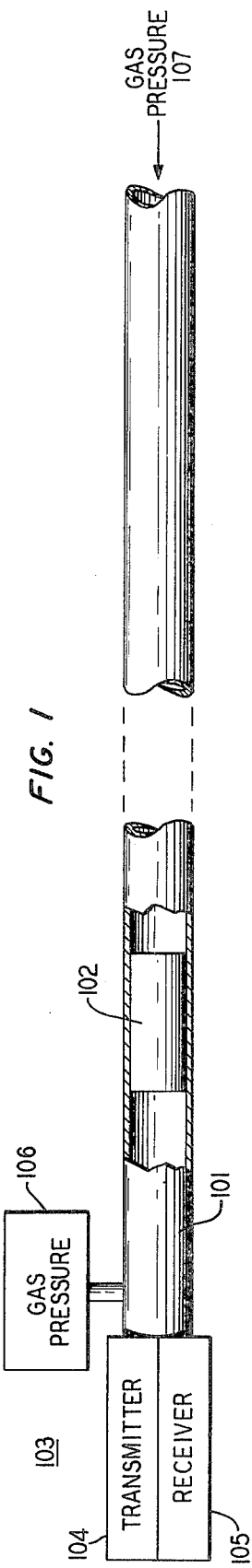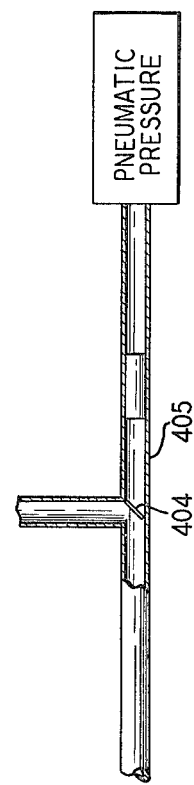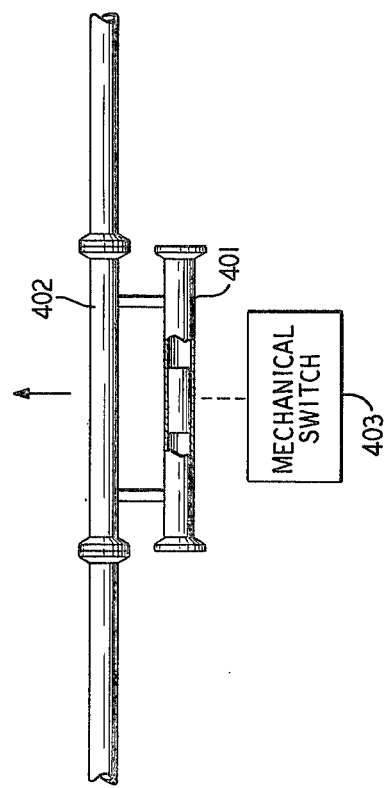

WAVEGUIDE FAULT LOCATION SYSTEM

BACKGROUND OF THE INVENTION

This invention relates to waveguide transmission systems and, more particularly, to a system for locating faults in an overmoded waveguide transmission line.

A waveguide fault which is induced by mechanical damage from an outside source such as an accidental dig-up that results in a crushing or rupture of the waveguide protective sheath, is readily locatable by a gas pressure fault location system and visual inspection of route for the dig-up. Internal waveguide faults, however, are not locatable with a gas pressure fault location system or route inspection. For example, one type of internal fault that causes transmission impairment is a weld failure at a waveguide joint. Similarly, a delamination of the dielectric liner can cause some level of transmission degradation depending upon the extend of delamination. Also, a stress or chemical corrosion of the copper plating due to processing faults will result in a transmission loss due to the ohmic loss increase of the guide's inner surface. An electrical fault location system is required to precisely locate these interior waveguide faults that increase the transmission loss of the waveguide.

Standard waveguide fault location techniques which locate the fault by measuring the reflections generated therefrom can not be employed in an overmoded waveguide transmission line. Since a waveguide fault in an overmoded waveguide excites other transmission modes in which the forward scattering of energy is dominant, the amount of energy transmitted in the backwards direction from a waveguide fault is not sufficient to determine its location.

A fault location system for an overmoded waveguide transmission line is described in U.S. Pat. No. 3,750,012 issued July 31, 1973 to R. G. Fellers and L. W. Hinderks. In that system, reflectors are periodically spaced within a waveguide to enable the detection of an increased transmission loss between two consecutive reflectors. In response to such an increased loss, a fault can be determined to exist between two reflectors. In a waveguide system of significant length, however, a large number of reflectors must be inserted into the waveguide. Since, however, each reflector comulatively contributes to the forward loss of a transmitted data or voice signal, either the number of reflectors inserted in the waveguide must be limited or the reflectors must be designed to be responsive only within a specific frequency band. Therefore, either a fault can be localized within only a long section of waveguide, or the reflectors must be precisely engineered, the latter prohibitively increasing the cost of a waveguide fault location system. In addition, in the latter situation a frequency band must be designated for only testing purposes, thereby reducing the available bandwidth for data and voice transmission. In either situation, however, a fault can be determined to exist only between two fixed reflectors.

SUMMARY OF THE INVENTION

It is an object of the present invention to provide a system for precisely locating a waveguide fault in an overmoded waveguide transmission line.

In accordance with the present invention a fault interior to a waveguide is located by pneumatically propelling an electrically semi-transparent reflecting piston within the waveguide line. The piston is designed to give low forward insertion loss yet at the same time a sufficient reflection in response to a transmitted millimeter wave test pulse stream. By measuring the magnitude of the signal reflected from the movable piston and returned to the transmitting terminal as the piston is moved along the waveguide length, the transmission loss of the waveguide is determined as a function of distance from the transmitting terminal. By examining the transmission loss measurements for any abnormal step or slope change or ripple which would be indicative of a waveguide fault, the location of a waveguide fault is precisely determined.

It is a feature of the present invention that faults can be located without interrupting data and voice transmission on the waveguide system.

BRIEF DESCRIPTION OF THE DRAWINGS

FIG. 1 shows a waveguide fault location system employing the principles of the present invention;

FIGS. 4A and 4B show apparatus for switching the test piston into a waveguide fault location system of the present invention.

DETAILED DESCRIPTION

Figure 2A:
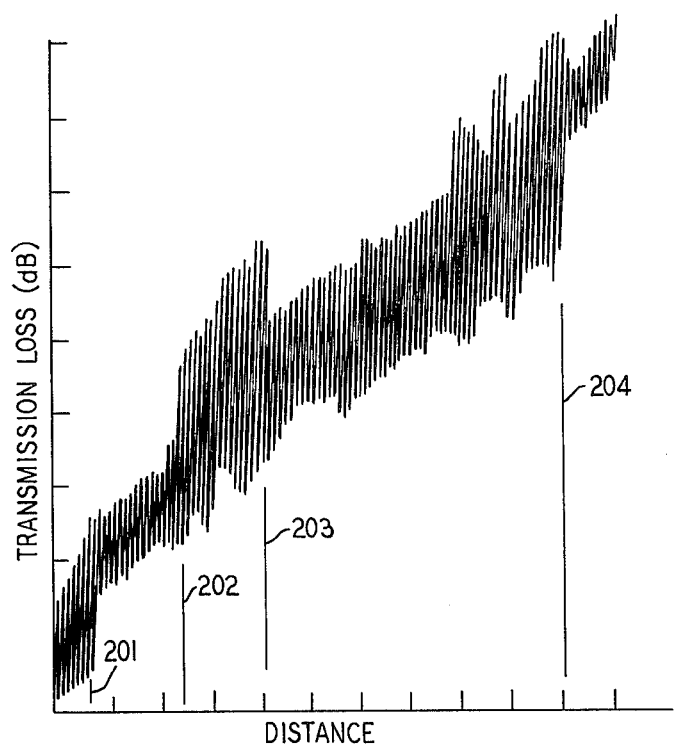
FIG. 2A is a transmission loss characteristic for the waveguide in FIG. 1.

FIG. 1 shows a system for locating faults in a circular waveguide 101 in accordance with the present invention. A cylindrical piston 102 is located interior to waveguide 101 and has dimensions such that it can be readily moved within the waveguide. Piston 102 can be made from any one of a plurality of dielectric materials having a dielectric constant greater than one. In addition piston 102 is chosen to have a low forward loss (i.e., piston is electrically semi-transparent) so that voice and data signals transmitted in the waveguide pass through the piston virtually unattenuated. An expanded foam piston has been found to have a forward insertion loss of approximately 0.1 db. In addition, the expanded foam piston has been found to have a return loss of about 25 db. Sufficient energy is thus reflected by the foam piston in response to a transmitted test signal so that a reflected signal can be detected at a waveguide terminal. Although not shown in the embodiment of the present invention in FIG. 1, piston 102 may additionally include a cylindrical fluorcarbon shell circumferentically disposed on the foam inner core for mechanical reinforcement. Furthermore, a thin dielectric disc can be attached to one end of the foam piston to enhance its reflection properties.

A test set 103 is connected to one end of the waveguide 101. Included within test set 103 is a transmitter 104 and a receiver 105. Not shown in FIG. 1 but also connected to each end of the waveguide 101 are signaling terminals for transmitting and receiving voice and data signals in the $TE_{01}$ mode. Sources of gas pressure 106 and 107 at each end of the waveguide create a pressure differential between the circular surfaces of piston 102. By increasing the pressure generated by source 106 above that generated by source 107, the pressure differential existing between the left and right hand surfaces of piston 102, propells the piston within the waveguide away from test set 103.

Transmitter 104 generates a microwave pulse stream which is propagated along the waveguide 101 in the $TE_{01}$ mode. When a pulse reaches piston 102 a portion of the pulse is reflected and propagated back along the waveguide to receiver 105. Receiver 105 includes a reflectometer for measuring low level signals, which is necessary because of the high transmission loss of the signals reflected at long distances. Receiver 105 detects the reflected pulse and measure its energy content and the time delay of propagation. The location of the piston at the time of reflection is determined by multiplying the group velocity of the test signal with one-half of the measured time delay. The round trip transmission loss is determined by comparing the energy content of the transmitted pulse with the energy in the pulse detected by the reflectometer. Since piston 102 is being propelled along the waveguide, each pulse in the test pulse stream is reflected by the piston at a different waveguide location. By measuring the energy content of successively reflected pulses, the round trip transmission loss for the length of the waveguide is determined.

The measured transmission loss characteristic for a waveguide having no interior fault is illustrated in FIG. 2A. Since other modes are generated from the transmitted $TE_{01}$ mode along the waveguide length which periodically either reinforce or weaken the transmitted signal, the transmission loss characteristic of FIG. 2A contains an oscillatory component. Modal converters are located within the waveguide interior to reconvert these generated modes to the transmitted $TE_{01}$ mode. A step change in the transmission loss characteristic can be noted at each modal converter waveguide location such as 201, 202, 203, and 204.

When a fault exists within a waveguide line, the measured transmission loss characteristic will have an abnormal step or slope change or ripple at the fault location. Therefore, once transmission degradation is noticed in the transmitted voice or data signals, the transmission loss of the waveguide is measured with the apparatus described hereinabove. This measured transmission loss is compared with a transmission loss characteristic determined when the waveguide was installed. An abnormal step or slope change or ripple not attributable to a modal converter indicates the fault position.

Figure 2B:
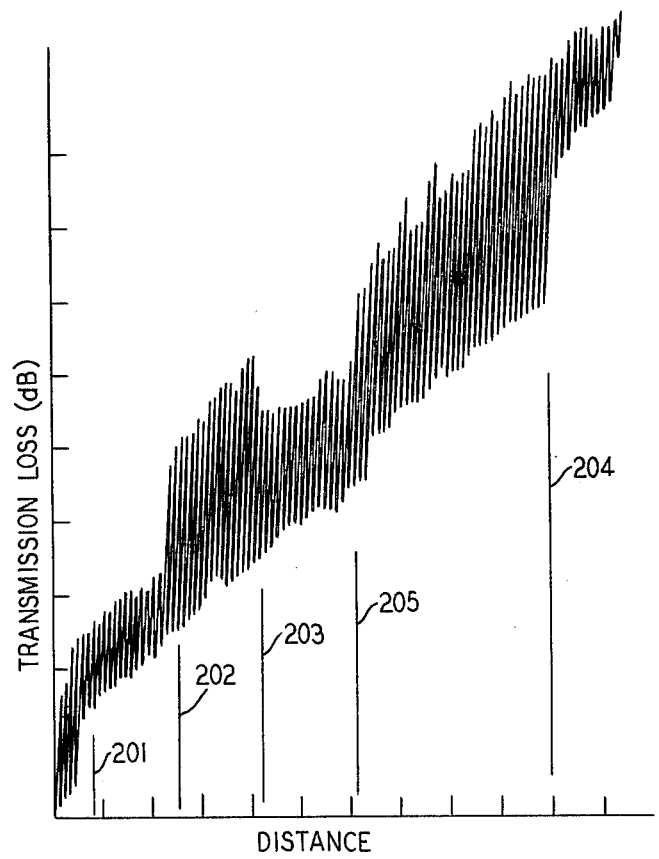
FIG. 2B is the transmission loss characteristic when the waveguide in FIG. 1 has an interior fault.

The transmission loss characteristic of a faulted waveguide is illustrated in FIG. 2B. By comparing the transmission characteristic of FIG. 2A with the transmission loss characteristic of FIG. 2B, a discontinuity is noted at point 205. It is thus presumed that a fault exists at this waveguide location. A maintenance crew can thus dig up the waveguide channel at the precise location of the fault to repair the damaged section.

With reference again to FIG. 1, if a contaminate enters the waveguide channel to impede the movement of piston 102, the reflectometer in receiver 105 indicates its position. Thus an obstruction within the waveguide is readily located.

Figure 3A:
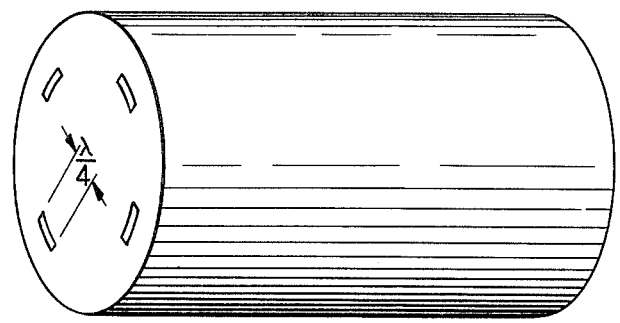
FIGS. 3A and 3B show alternative movable pistons that may be employed in the fault location system of FIG. 1.
Figure 3B:
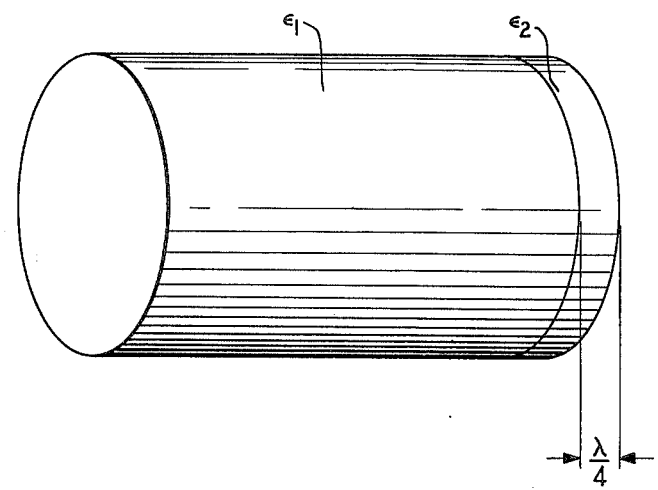

In the embodiment of the present invention discussed hereinabove, piston 102 is composed of a single uniform foam dielectric material. The piston has a low forward insertion loss in response to the data and voice signals transmitted along but still has a sufficient reflection in response to the millimeter wave test pulse stream so that receiver 105 can measure the reflected test signal. In certain applications it may be desirable to enhance the magnitude of the reflected signal at a selected frequency. Accordingly, a piston can be designed to have an increased reflection coefficient at the test signal frequency. FIGS. 3A and 3B each show a tuned piston which may be employed in the present invention which have an enhanced reflection at a desired test signal frequency. In FIG. 3A, tuned dipole elements are attached to the piston. These dipole elements can be attached to the piston singly or in arrays. Each dipole has a length $\lambda/4$, where $\lambda$ is the wave length of the test signal frequency at which enhanced reflection is desired. In FIG. 3B, an alternative tuned piston is illustrated which is a two-layered cylindrical device. Each layer is composed of a different dielectric material, with the thickness of one layer being $\lambda/4$, where $\lambda$ is as defined hereinabove.

Since the movable piston is designed to have a low forward insertion loss in response to the transmitted data and voice signals, it may be installed within a waveguide on a permanent basis without degrading signal transmission. It may be desirable, however, to insert the piston into the waveguide only when the need for fault location arises as a result of a measured forward transmission degradation. FIG. 4A illustrates one method for inserting the piston into a waveguide. With reference to FIG. 4A, a switchable waveguide section 401, which has the movable piston stored within, is connected to a waveguide section 402. When fault location is desired, section 401 can be switched into the waveguide using an explosive charge or other mechanical switching apparatus 403 to minimize the interruption of voice and data traffic. FIG. 4B illustrates the insertion of a stored piston into a waveguide having an elbow. The waveguide is provided with a movable mirror 404 which flips out of the way in response to the pneumatic pressure applied to the piston in its stored position 405.

The above described arrangement is illustrative of the application and principles of the invention. Other embodiments may be devised by those skilled in the art without departing from the spirit and scope of the invention.

What is claimed is:

1. Apparatus for locating faults in a waveguide transmission line having a known transmission loss characteristic along the length thereof comprising means for transmitting a test signal through said waveguide line, movable reflecting means internal to said waveguide transmission line for reflecting a portion of said test signal, said movable reflecting means transmitting therethrough substantially all the energy of electrical signals transmitted on said waveguide line, means for propelling said movable reflecting means along the length of said waveguide line, and means for measuring the transmission loss of said portions reflected as said reflecting means is moved along said waveguide so that deviations from said known transmission loss characteristic can be detected and faults can be located.

2. Apparatus in accordance with claim 1 wherein said movable reflecting means comprises a dielectric material having a dielectric constant greater than one.

3. Apparatus in accordance with claim 1 wherein said test signal is transmitted at a predetermined frequency, and said movable reflecting means includes means for reflecting an increased portion of said test signal at said predetermined frequency.

4. Apparatus in accordance with claim 3 wherein said means for reflecting an increased portion includes at least one dipole attached to said reflecting means, the length of said at least one dipole being determined from said predetermined frequency.

5. Apparatus in accordance with claim 3 wherein said reflecting means has a plurality of dielectric layers, at least one of said layers comprising a first dielectric material, and at least one other of said layers comprising a second dielectric material, the thickness of said at least one other layer being determined from said predetermined frequency.

6. Apparatus in accordance with claim 1 further comprising means for switching said reflecting means into said waveguide line for locating faults.

7. Apparatus in accordance with claim 2 wherein said means for propelling includes means for increasing the differential pressure in said waveguide line on said movable reflecting means.

8. Apparatus for measuring the transmission loss characteristic of a waveguide comprising means for transmitting a test signal through said waveguide, movable reflecting means interior to said waveguide for reflecting a portion of said test signal, said movable reflecting means transmitting therethrough substantially all the energy of signals transmitted on said waveguide, means for propelling said movable reflecting means within said waveguide, and means for measuring the portions reflected as said movable reflecting means is propelled within said waveguide.

9. Apparatus in accordance with claim 8 wherein said movable reflecting means comprises a dielectric material having a dielectric constant greater than one.

10. Apparatus in accordance with claim 9 wherein said reflecting means includes means for reflecting an increased portion of said test signal at a predetermined frequency.

11. Apparatus in accordance with claim 9 further comprising means for switching said reflecting means into said waveguide for measuring said transmission loss characteristic.

* * * * *